United States Patent [19]

Kubo et al.

[11] Patent Number: 5,280,677
[45] Date of Patent: Jan. 25, 1994

[54] POSITIONING MECHANISM

[75] Inventors: Tadayuki Kubo, Tsuchiura; Eiji Osanai, Yokohama, both of Japan

[73] Assignee: Canon Kabushiki Kaisha, Tokyo, Japan

[21] Appl. No.: 29,956

[22] Filed: Mar. 9, 1993

Related U.S. Application Data

[63] Continuation of Ser. No. 700,466, May 15, 1991, abandoned.

[30] Foreign Application Priority Data

May 17, 1990 [JP] Japan ............................ 2-125378
May 17, 1990 [JP] Japan ............................ 2-125379

[51] Int. Cl.⁵ ............................................ B23Q 16/00
[52] U.S. Cl. ........................................ 33/568; 33/1 M; 359/393
[58] Field of Search ................ 33/573, 613, 577, 568, 33/1 M; 359/392, 393; 250/201.3, 201.4, 201.8

[56] References Cited

U.S. PATENT DOCUMENTS

| | | | |
|---|---|---|---|
| 4,230,940 | 10/1980 | Minami et al. | 250/201.3 |
| 4,575,942 | 3/1986 | Moriyama | 33/568 X |
| 4,635,887 | 1/1987 | Hall et al. | 33/568 X |
| 4,798,006 | 1/1989 | Barnaby | 33/503 X |
| 4,958,437 | 9/1990 | Helms | 33/1 M X |

*Primary Examiner*—Thomas B. Will
*Attorney, Agent, or Firm*—Fitzpatrick, Cella, Harper & Scinto

[57] ABSTRACT

A positioning device, includes a first positioning portion for moving an article in a direction substantially perpendicular to a predetermined plane and/or in a direction inclined with respect to the predetermined plane; a second positioning portion for moving the article in a direction substantially parallel to the predetermined plane, wherein the first positioning portion is mounted on the second positioning portion; a base member on which the second positioning portion is mounted; and a position detecting system for controlling movement of the article through the first positioning portion, the position detecting system being operable to measure displacement with respect to the surface of the base member.

16 Claims, 1 Drawing Sheet

POSITIONING MECHANISM

This application is a continuation of application Ser. No. 07/700,466 filed May 15, 1991 now abandoned.

FIELD OF THE INVENTION AND RELATED ART

This invention relates to a positioning mechanism for use in the positioning of an article. More particularly, the invention is concerned with a positioning mechanism usable in various instruments such as a measuring instrument or in exposure apparatuses for the reproduction of fine patterns on a semiconductor wafer in a lithographic process of a semiconductor device manufacture, for positioning an article quickly and precisely.

A positioning mechanism is known with which an article to be driven can be positioned in a direction (Z axis) perpendicular to a predetermined target plane (X-Y plane) as well as in a tilt direction inclined with respect to the target plane. An example of such mechanism uses a rolling or sliding guide for an article to be driven and a pulse motor as a drive source therefor. Another example uses a resilient support guide (leaf spring means or the like) in combination with a piezoelectric device as a drive source, in an attempt to attain enhanced positioning precision.

In conventional mechanisms, however, where the mechanism is mounted on an X-Y table or stage, for example, as a positioning means for positioning an article with respect to a direction parallel to a predetermined target plane or in a rotational ($\theta$) direction about a Z axis, there is a problem that the positioning time is prolonged due to vibration of the article caused by acceleration at the start or stop of movement of the X-Y stage, for example. Further, if the X-Y stage on which the positioning mechanism is mounted has inferior attitude precision with respect to the tilt direction, the positioning precision in the tilt direction is also degraded.

SUMMARY OF THE INVENTION

It is accordingly a primary object of the present invention to provide an improved positioning mechanism with which an article to be driven can be positioned very quickly and very precisely.

It is another object of the present invention to provide an improved positioning mechanism with which an article to be driven can be positioned providing a reduction in the effect of vibration on the article.

It is a further object of the present invention to provide an improved positioning mechanism with which an article can be positioned providing a reduction in the effect of vibration on an X-Y stage or on the attitude precision of the X-Y stage.

In accordance with an aspect of the present invention, a positioning mechanism operates to position an article in a direction (Z axis) perpendicular to a predetermined target plane (X-Y plane) and/or in a tilt direction inclined with respect to the target plane, wherein the mechanism includes a plurality of actuators for moving the article in the Z-axis direction and a plurality of dampers disposed to have a shift in phase with respect to the actuators.

This arrangement is effective to attenuate vibration caused by acceleration during the starting or stopping of a stage on which the mechanism is mounted, residual vibration as the article is moved by the actuators, or vibration due to any external disturbance. Since the vibration of the article can be attenuated effectively, the article can be positioned very quickly and very precisely.

In another aspect of the present invention, the positioning mechanism uses a reference plane of a base plate on which an X-Y stage is mounted, as a reference for measurement of the quantity of drive of the article in the Z-axis direction. This ensures measurement of a change in attitude of the article in the Z-axis direction or in the tilt direction and, therefore, high-precision positioning of the article with respect to the target plane.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
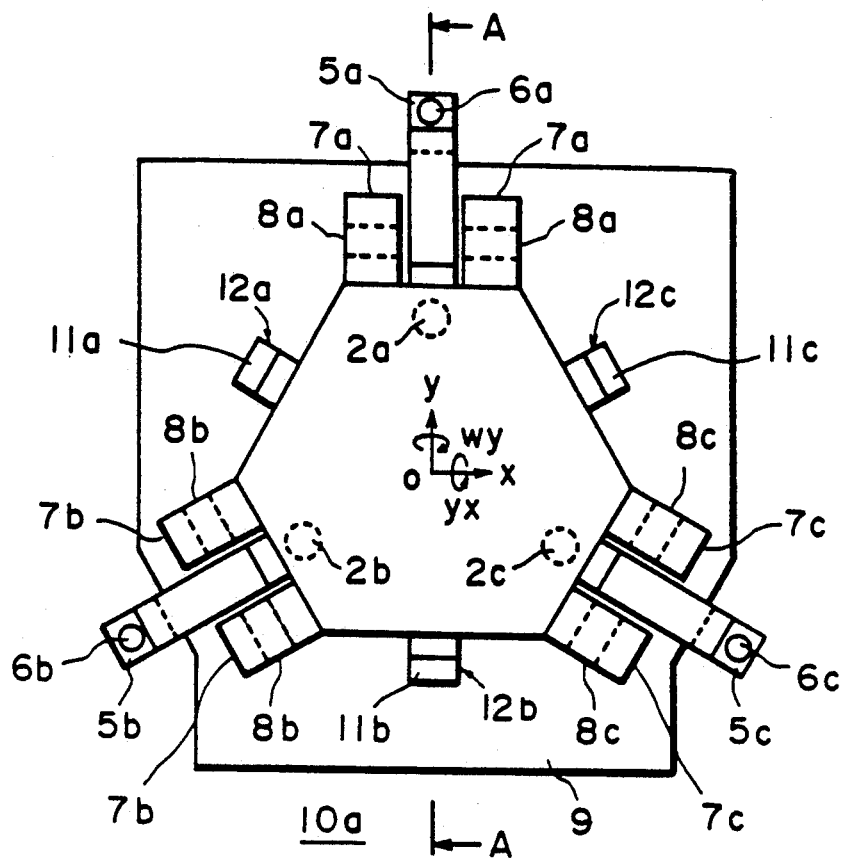
FIG. 1 is a top plan view of a positioning mechanism according to an embodiment of the present invention.
Figure 2:
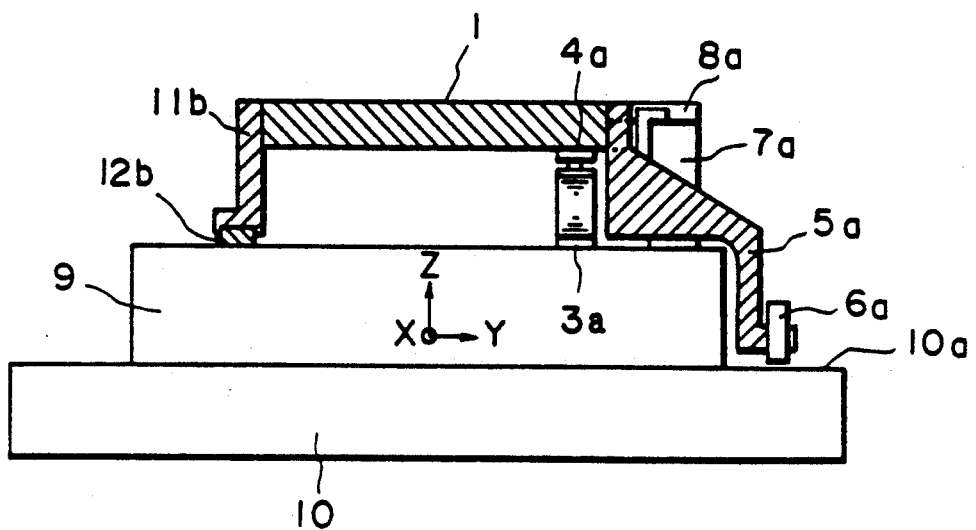
FIG. 2 is a sectional view taken on line A—A in FIG. 1.

In FIGS. 1 and 2, denoted at 1 is movable member on which a semiconductor wafer, for example, is to be placed. The movable member 1 can be moved in a vertical or Z-axis direction by means of actuators 2a, 2b and 2c each comprising a piezoelectric device, for example. These piezoelectric devices 2a-2c are fixed to an X-Y stage 9 by fixing members 3a, 3b and 3c, respectively. The movable member 1 is supported by the actuators 2a-2c through corresponding resilient hinges 4a, 4b and 4c. These resilient hinges 4a-4c are operable to prevent displacement of corresponding actuators 2a-2c, other than that in the Z-axis direction, from being transmitted to the movable member 1. The X-Y stage 9 has a structure which is known per se. It is movable along the X-Y (horizontal) plane, perpendicular to the Z axis, and in X and Y axis directions while being guided by a guide rail means (not shown).

Each of the actuators 2a-2c is fixed to a corresponding one of the fixing members 3a-3c and corresponding one of the resilient hinges 4a-4c, by means of bonding, for example. Also, the fixing members 3a-3c are fixed to the X-Y stage 9 by means of bolts, for example. The resilient hinges 4a-4c are fixed to the movable member 1 by means of bolts, for example. The three actuator mechanisms provided by the three piezoelectric actuators and the like, are disposed substantially equiangularly on the X-Y plane, about the center O of the movable table 1, as illustrated in FIG. 1.

Denoted at 5a, 5b and 5c are sensor holders which are fixed to the movable member 1, and denoted at 6a, 6b and 6c are non-contact displacement gauges of eddy current type or electrostatic capacitance type, for example. These displacement gauges are fixed to the movable member 1 through corresponding sensor holders 5a-5c, with a predetermined clearance in the Z-axis direction to a reference surface 10a of a base member 10 on which the X-Y stage 9 is placed. The displacement gauges 6a-6c are disposed substantially equiangularly on the X-Y plane about the center O of the movable member 1, with the same phase as the disposition of the three actuator mechanisms. Each displacement gauge is operable to measure the displacement of the movable member 1 at that position, relative to the reference surface 10a and in the Z-axis direction.

Each of the sensor holders 5a-5c is fixed to the movable member 1 at a position adjacent to corresponding resilient hinge 4a, 4b or 4c, and it extends along the X-Y plane in a direction outwardly from the center O. Each sensor holder has an end portion, holding corresponding displacement gauge 6a, 6b or 6c, which portion extends along the Z-axis direction.

Denoted at 7a, 7b and 7c are support members which are fixed to the X-Y stage 9, and denoted at 8a, means has an end fixed to corresponding support member 7a, 7b or 7c and another end fixed to the movable member 1. Each leaf spring means comprises a pair of leaf springs which are disposed at the opposite sides of corresponding sensor holder 5a, 5b or 5c. Like the disposition of the three actuator means, the three sets of leaf spring means 8a-8c are disposed substantially equiangularly on the X-Y plane about the center O of the movable member 1. The movable member 1 is resiliently supported by these leaf spring means so that it is displaceable in the Z-axis direction.

Denoted at 11a, 11b and 11c are arms fixed to the movable member 1, and denoted at 12a, 12b and 12c are damping rubbers (dampers). Each of the damping rubbers 12a-12c is fixed by adhesion, for example, to corresponding arm 11a, 11b or 11c. Also, it contacts to the X-Y stage 9 with a suitable deformable margin as seen in FIG. 2. As illustrated, these damping rubbers 12a-12c are disposed substantially equiangularly on the X-Y plane about the center O of the movable member 1, with a phase shifted to that of the disposition of the actuator mechanisms (including the actuators 2a-2c), so that each damping rubber is located at a position diametrically opposed to the position of corresponding piezoelectric actuator 2a, 2b or 2c with respect to the center O.

While not shown in the drawings, the movable member 1 is equipped with a reference mirror to be used with a laser optical interference distance gauge for the positioning of the X-Y stage 9 in the X and Y axis directions.

When in operation a voltage is applied to the piezoelectric actuators 2a-2c from an external controller, the movable member 1 is positioned with respect to the vertical and inclined directions (Z-axis direction and Wx and Wy directions) through the drives of the actuators 2a-2c. Also, movable member 1 is positioned at a desired location on the X-Y plane by means of the X-Y stage 9. Here, the quantity of displacement of the movable member 1 in the vertical or any inclined direction can be measured by means of the non-contact displacement gauges 6a-6c, with feedback control through the external controller based on outputs of the displacement gauges. Since the displacement gauges 6a-6c are disposed opposed to the reference surface 10a, it is possible to measure the displacement of the movable member 1, including a change in attitude of the X-Y stage 9 in the Wx or Wy direction. Therefore, it is possible to accomplish high-precision positioning with respect to the target plane. Further, since the damping rubbers (dampers) 12a-12c are so disposed as illustrated with suitable deformable margin to the X-Y stage 9, it is possible to effectively attenuate any vibration in the Wx direction (rotational component about the X axis), in the Wy direction (rotational component about the Y axis) or in a direction which is a composite of them, to be induced by acceleration during the starting or stopping of the X-Y stage 9. Also, it is possible to effectively attenuate residual vibration as the movable member is driven by the actuators 2a-2c or vibration caused by any external disturbance. As a result, high-speed and high-precision positioning is ensured.

The actuator for driving the movable member is not limited to the piezoelectric device. As an example, a combination of a motor and a feed screw may be used. Alternatively, the movable member may be driven through a lever or a wedge-like member.

The leaf spring means 8a, 8b or 8c may be replaced by a resilient hinge formed integrally with the movable member 1.

The damper is not limited to the damping rubber. For example, viscous resistance to be provided by a silicon oil or the like may be used.

The X-Y stage may be a single-axis table or a rotary table.

While the invention has been described with reference to the structures disclosed herein, it is not confined to the details set forth and this application is intended to cover such modifications or changes as may come within the purposes of the improvements or the scope of the following claims.

What is claimed is:

1. A device comprising:
    first positioning means for moving a movable member, on which an article is to be placed, in at least one of a direction substantially perpendicular to a predetermined plane and in a direction inclined with respect to the predetermined plane;
    second positioning means for moving the movable member in a direction substantially parallel to the predetermined plane, wherein said first positioning means is mounted on said second positioning means;
    a base member on which said second positioning means is mounted;
    position detecting means for controlling movement of the movable member through said first positioning means, said position detecting means being operable to measure displacement with respect to the surface of said base member; and
    damping means provided between said first positioning means and said second positioning means.

2. A device according to claim 1, wherein said position detecting means includes a non-contact guage.

3. A device according to claim 1, wherein said first positioning means includes a plurality of actuator mechanisms and wherein said damping means includes a plurality of damping mechanisms.

4. A device according to claim 3, wherein said actuator mechanisms and said damping mechanisms are disposed substantially equiangularly on a plane substantially parallel to the predetermined plane, about a center of the movable member.

5. A device according to claim 4, wherein said actuator mechanisms and said damping mechanisms are disposed diametrically opposed to each other with respect to the center of the movable member.

6. A device according to claim 1, wherein the article is a semiconductor wafer.

7. A device according to claim 3, wherein the number of said actuator mechanisms is three.

8. A positioning device comprising:
    positioning means for moving a movable member, on which an article is to be placed in at least one of a direction substantially perpendicular to a predetermined plane and in a direction inclined with respect to the predetermined plane; and damping means provided between the movable member and a surface on which said positioning means is mounted, wherein said positioning means includes a plurality of actuator mechanisms and wherein said damping means includes a plurality of damping mechanisms, and wherein said actuator mechanisms and said damping mechanisms are disposed substantially equiangularly on a plane substantially parallel to the predetermined plane, about a center of the movable member.

9. A device according to claim 8, wherein said actuator mechanisms and said damping mechanisms are disposed with mutually shifted phases.

10. A device according to claim 8, wherein said damping means includes a damping rubber.

11. A device according to claim 8, wherein said damping means uses viscosity resistance.

12. A device according to claim 8, wherein the article is a semiconductor wafer.

13. A device according to claim 8, wherein the number of said actuator mechanisms is three.

14. A positioning device in a semiconductor element manufacturing apparatus, said device comprising:

first positioning means for moving a movable member, on which a semiconductor wafer is to be placed in at least one of a direction substantially perpendicular to a predetermined plane and in a direction inclined with respect to the predetermined plane;

second positioning means for moving the movable member in a direction substantially parallel to the predetermined plane, wherein said first positioning means is mounted on said second positioning means;

a base member on which said second positioning means is mounted; and damping means provided between the movable member and the surface of said second positioning means on which said first positioning means is mounted.

15. A positioning device, comprising:

first positioning means for moving a movable member, on which an article is to be placed, in at least one of a direction substantially perpendicular to a predetermined plane and in a direction inclined with respect to the predetermined plane;

second positioning means for moving the movable member in a direction substantially parallel to the predetermined plane, wherein said first positioning means is mounted on said second positioning means;

a base member on which said second positioning means is mounted, and position detecting means for controlling movement of the movable member through said first positioning means, said position detecting means being operable to measure displacement with respect to the surface of said base member, and said position detecting means being mounted integrally on said first positioning means.

16. A positioning device according to claim 15, wherein the article is a semiconductor wafer.

* * * * *

UNITED STATES PATENT AND TRADEMARK OFFICE
CERTIFICATE OF CORRECTION

PATENT NO. : 5,280,677
DATED : January 25, 1994
INVENTOR(S) : TADAYUKI KUBO, ET AL.

It is certified that error appears in the above-indentified patent and that said Letters Patent is hereby corrected as shown below:

COLUMN 3
    Line 3, "the," should read --the--.
    Line 12, "8a, means" should read --8a, 8b and 8c are leaf springs means.  Each leaf spring means--.
    Line 28, "to" should be deleted.

COLUMN 4
    Line 48, "guage." should read --gauge.--.

Signed and Sealed this

Eleventh Day of October, 1994

Attest:

BRUCE LEHMAN

*Attesting Officer*     *Commissioner of Patents and Trademarks*